United States Patent [19]
Kane et al.

[11] 3,962,590
[45] June 8, 1976

[54] TTL COMPATIBLE LOGIC GATE CIRCUIT

[75] Inventors: Jack Kane, Bethlehem; Richard Alan Pedersen, Allentown, both of Pa.

[73] Assignee: Bell Telephone Laboratories, Incorporated, Murray Hill, N.J.

[22] Filed: Aug. 14, 1974

[21] Appl. No.: 497,137

[52] U.S. Cl. ............................... 307/214; 307/213; 307/299 A; 307/317 A; 307/DIG. 1; 357/15; 357/40
[51] Int. Cl.² ................ H03K 19/08; H03K 19/12; H03K 19/40; H01L 29/48
[58] Field of Search ............... 307/214, 213, DIG. 1, 307/299 A, 317 A, 215, 218

[56] References Cited
UNITED STATES PATENTS

| | | | |
|---|---|---|---|
| 3,218,483 | 11/1965 | Clapper | 307/214 |
| 3,518,458 | 6/1970 | Camenzind | 307/299 A X |
| 3,623,925 | 11/1971 | Jenkins et al. | 307/317 A X |
| 3,660,676 | 5/1972 | Fleischhammer et al. | 307/299 A X |
| 3,699,362 | 10/1972 | Jordan | 307/299 A X |
| 3,769,524 | 10/1973 | Mathews | 307/317 A X |
| 3,860,830 | 1/1975 | Akio et al. | 307/214 X |

OTHER PUBLICATIONS

Park, "True-Complement Generator Circuit with Schottky Barrier Diodes," *IMB Tech. Discl. Bull.*; vol. 16, No. 4, pp. 1280; 9/1973.
Chang, "True-Complement Generator"; *IBM Tech. Discl. Bull.*; vol. 15, No. 4, pp. 1098–1099; 9/1972.

*Primary Examiner*—John S. Heyman
*Assistant Examiner*—Larry N. Anagnos
*Attorney, Agent, or Firm*—P. Abolins; R. B. Anderson; L. C. Canepa

[57] ABSTRACT

A logic gate circuit includes a resistance divider input to the base of an input transistor and a multiple emitter output transistor in an emitter follower configuration. The circuit has favorable switching speed and power dissipation characteristics and reduces the effect of both capacitive loading and series resistance in signal interconnections. An efficient layout of one such logic circuit has intercell wiring channels formed across the circuit and has the inputs and outputs of the circuit arranged in two lines each of which crosses perpendicular to the wiring channels.

7 Claims, 6 Drawing Figures

TTL COMPATIBLE LOGIC GATE CIRCUIT

BACKGROUND OF THE INVENTION

This invention relates to an improved logic arrangement suitable for incorporation in an integrated semiconductor apparatus.

Various types of digital logic circuits which are particularly amenable to fabrication as a monolithic integrated circuit network have been developed. For example, known logic arrangements include resistor-transistor logic (RTL) and transistor-transistor logic (TTL). Operating characteristics which are often important in applications include switching speed, power dissipation, output current and response to load variations.

To improve the operation of logic gate circuits, it is desirable to have reduced power dissipation, smaller size and increased speed. It is further desirable to have a more attractive logic gate for use with large scale integration requiring resistive crossunders.

SUMMARY OF THE INVENTION

The invention is a logic gate circuit and an integrated layout for the circuit. The logic gate circuit includes a first resistance divider input to the base of an input transistor. One terminal node of the first resistance divider is connected to the input. The other terminal node is connected to ground. An intermediate node is connected to the base of the input transistor. The emitter of the input transistor is grounded and the collector of the input transistor is serially connected to a voltage source through a second resistance divider.

The logic gate circuit further includes a multiple emitter output transistor in the emitter follower configuration. The base of the output transistor is connected to an intermediate point in the second resistance divider. The collector of the output transistor is connected to the voltage source. The emitters of the output transistor are each connected to a different output node.

The emitter follower output provides a low resistance path for output current which is advantageous when charging capacitive loads. A relatively high input resistance is provided by the input resistance divider. This is advantageous to reduce the effect of series resistance introduced into the signal path. Further, the magnitudes of the resistances in the logic gate circuit can be chosen to provide a relatively small voltage swing in the output voltage. A small voltage swing reduces the amount of charging of a capacitive load and is advantageous in obtaining high speed switching. The magnitude of the output voltage is dependent upon the ratio of resistances rather than upon only the magnitudes of the resistances. Because the magnitudes of the resistors tend to vary similarly when temperature varies, the effect of resistance changes due to temperature on the output voltage is eliminated. Output voltage levels can be a function of the base-emitter voltage of the input transistor and vary as the base-emitter voltage varies with temperature.

The layout of one such logic gate circuit, or cell, can have intercell wiring channels formed across the cell and the inputs and outputs of the cell arranged in two lines each of which crosses perpendicular to the wiring channel. The intercell wiring is selectively connected to the inputs and outputs of the cell. Advantageously, intracell wiring is done primarily in a portion of the cell not beneath the intercell wiring.

DETAILED DESCRIPTION

Figure 1:
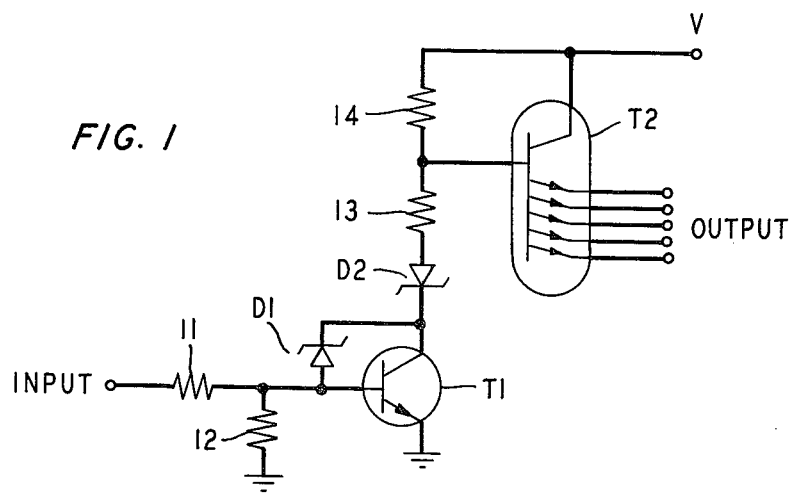
FIG. 1 shows a schematic drawing of a specific illustrative logic gate circuit made in accordance with the principles of the present invention.

FIG. 1 shows a schematic diagram of a logic gate in accordance with an embodiment of this invention. As shown, the input to the logic gate is applied to one node of a resistor 11. The other node of resistor 11 is connected to the base of an input transistor T1. A resistor 12 is connected between the base of the input transistor T1 and ground. Transistor T1 is advantageously a Schottky clamped transistor as shown by the connection of a Schottky barrier diode D1 between the collector and the base of transistor T1. The emitter of transistor T1 is grounded and the collector of transistor T1 is connected to a voltage V through a series connection of a resistor 13 and a resistor 14 and advantageously a Schottky barrier diode D2. The base of a multiple emitter output transistor T2 is connected to a point between resistors 13 and 14. The collector of transistor T2 is connected to voltage V and the emitters of transistor T2 are connected to respective output nodes.

In operation, the logic gate circuit of FIG. 1 performs an inverting function, that is, when the input is a logical zero the output is a logical one and when the input is a logical one the output is a logical zero.

When a logical zero, is relatively low potential level, is present at the input of the gate, transistor T1 is off, the collector voltage of transistor T1 approaches the voltage V, transistor T2 conducts and the output of the gate approaches the voltage V, or a logical one. The voltage at the base of transistor T1 is the input voltage, $V_{IN}$, times $R_{12}/(R_{11} + R_{12})$ and is insufficient (in the case of a logical zero) to turn on transistor T1. The output voltage at the emitter of transistor T2 is the voltage V less $V_{BE}(T2)$, the voltage drop from the base to the emitter of transistor T2, and less the voltage drop across resistor 14 due to $I_B(T2)$, the base current of transistor T2. That is, $V_{OH} = V - V_{BE(T2)} - I_{B(T2)}R_{14}$, where $V_{OH}$ is the emitter output high voltage of the logic circuit representing a logical one.

When a logical one is present at the input, transistor T1 is on, the collector voltage of transistor T1 approaches $V_{BE(T1)}$, the base-emitter voltage of transistor T1, less the voltage drop across Schottky barrier diode D1, and the output of the gate is a logical zero. As before, the voltage at the base of transistor T1 is given by $V_{IN}R_{12}/(R_{11} + R_{12})$ until transistor T1 turns on after which point it becomes clamped at $V_{BE(T1)}$. With transistor T1 on, the voltage output at the emitter of transistor T2 is reduced from its value when transistor T1 is off. The voltage at this reduced level is designated to represent a logical zero. More specifically, the output voltage at the emitter of transistor T2 is defined by $$V_{OL} = V_{BE(T1)} - V_{SBD(D1)} + V_{SBD(D2)}$$

$$+ (V - V_{BE(T1)} + V_{SBD(D1)} - V_{SBD(D2)}) \frac{R_{13}}{R_{13} + R_{14}} V_{BE(T2)}$$

where $V_{OL}$ is the emitter output low voltage representing a logical zero, $V_{SBD(D1)}$ is the voltage across Schottky barrier diode D1, $V$ is the power supply voltage, $V_{BE(T1)}$ is the base-emitter voltage of transistor T1, $V_{SBD(D2)}$ is the voltage across Schottky barrier diode D2, and $V_{BE(T2)}$ is the base-emitter voltage of transistor T2.

The Schottky-clamped configuration of transistor T1 is advantageous to prevent transistor T1 from reaching saturation, and thus to increase the operational speed of the circuit. The Schottky diode D1 has the characteristic that it conducts at a potential lower than that of the base-collector junction of transistor T1 and therefore prevents the base-collector junction from ever being forward biased. Since transistor T1 is prevented from saturating, the Schottky-clamped combination can turn off faster than the normal transistor alone, and its operation will more closely follow the drive potential applied to its base.

It is known that the temperature dependency of a Schottky barrier diode an be compensated by another Schottky barrier diode. Schottky barrier diode D2 is advantageously added to the circuit to compensate Schottky barrier diode D1. As can be seen from the above equation representing $V_{OL}$ the voltages across the two Schottky barrier diodes tend to cancel each other. To reduce temperature dependence it is particularly deirable for the voltage across Schottky barrier diode D1 to equal the voltage across Schottky barrier diode D2. The voltage across a Schottky barrier diode is a function of the diode cross sectional area and the current passing through it. Advantageously, these factors are adjusted so the voltages are equal. The cross sectional area is determined by the layout of the circuit and the current level by the choice of resistors in the circuit.

As already noted, the equations for the input and output voltages are dependent upon the ratios of resistances rather than upon the absolute values of any resistances. Therefore the resistance variation due to temperature tends to cancel out in the output voltage equation.

The magnitudes of resistor 13, resistor 14 and voltage V can be chosen so there is an attractive output voltage swing. The output voltage swing is the difference between the output voltage representing a logical one and the output voltage representing a logical zero. It is advantageous to have a small voltage swing which has controlled temperature variation. The voltage V can be made a function of a transistor base-emitter voltage by choosing an appropriate power supply. Thus temperature changes which cause changes in the base-emitter voltage are reflected in voltage V. A suitably small output voltage swing can be equal to the magnitude of the base emitter voltage of transistor T1. If the Schottky diode voltages cancel, the equation for determining voltage swing is:

$$V_{SWING} = V_{OH} - V_{OL}$$
$$= V - V_{BE(T1)} - I_{B(T2)}R_{14} - V_{BE(T1)} -$$
$$(V - V_{BE(T1)}) \frac{R_{13}}{R_{13} + R_{14}} + V_{BE(T2)}$$

To control temperature characteristics of the output voltage swing, the voltage V can be made a function of a base-emitter voltage of transistor T1 so it varies with $V_{BE(T1)}$. An attractive choice is to have V equal to $3V_{BE(T1)}$. As an approximation $V_{BE(T1)}$ and $V_{BE(T2)}$ can be considered to be about equal when transistors T1 and T2 are conducting. Also, as an approximation, the term $I_{B(T2)}R_{14}$ can be considered relatively small. Using $V_{BE(T1)} = V_{BE(T2)} = V_{BE}$ and $V = 3V_{BE}$, the voltage swing equation becomes:

$$V_{SWING} = 3V_{BE} - V_{BE} - V_{BE} - 2V_{BE} \frac{R_{13}}{R_{13} + R_{14}} + V_{BE} =$$

$$2V_{BE} - 2V_{BE} \frac{R_{13}}{R_{13} + R_{14}}.$$

If $R_{13}$ is chosen equal to $R_{14}$ then $V_{SWING} = V_{BE}$. Using the same approximations, the low output voltage representing a logical zero is $V_{BE}$ and the high output voltage representing a logical one is $2V_{BE}$.

To drive successive stages of logic circuits the input switching threshold voltage must be at a level within the output voltage swing. To provide a noise margin it would be advantageous to have the input switching threshold voltage midway in the output voltage level swing, or at $1.5 V_{BE}$. Then the output voltage can have a $0.5 V_{BE}$ noise margin. In other words, transistor T1 should begin to conduct when the input voltage, $V_{IN}$, is equal to $1.5 V_{BE}$. Since $V_{BE}$ is equal to $$V_{IN} \frac{R_{12}}{R_{11} + R_{12}},$$

it can be determined that $R_{11}$ must be set equal to one-half of the resistance $R_{12}$ to get the desired input switching threshold voltage. Illustrative values for the resistors in FIG. 1 are:

$R_{11} = 3.5 \times 10^3$ ohms, $R_{12} = 7.0 \times 10^3$ ohms, $R_{13} = 2.9 \times 10^3$ ohms and $R_{14} = 3.4 \times 10^3$ ohms.

It has been noted that the logic circuit shown in FIG. 1 has a resistance divider input in combination with an emitter follower output having multiple emitters and that this combination is advantageous in reducing the effects of both capacitance loading and series resistance in signal interconnections. Such effects are often introduced by forming diffused crossunders in a semiconductor substrate when fabricating a logic gate with a single level metallization. Accordingly, this circuit is advantageous for use with diffused crossunders.

Additionally, the emitter follower output with multiple emitters has the advantage that current in any given single emitter output path is at most the current required for a single logical one. If the number of fanouts is increased, the number of emitters can also be increased. This is advantageous because no crossunder in an output path must carry more than the amount of current representing a logical one. In contrast, a circuit having a single emitter output path has any additional fanouts connected to the single emitter. As a result, the single emitter transistor may experience undesirable load variations and saturation effects. In addition, a crossunder in such a single emitter output might be required to handle output current greater than the amount needed to represent a logical one.

Figure 2:
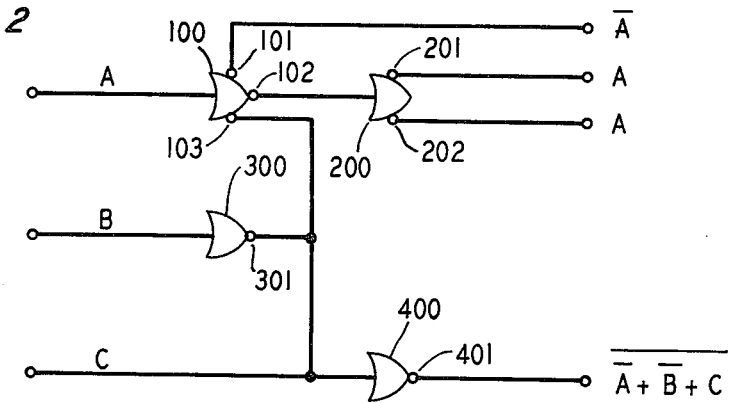
FIG. 2 shows a connection of a plurality of the FIG. 1 logic gate circuits to form various logic functions.

It is well known that logic functions other than inversion can be derived from appropriate connection of inverting logic circuits such as that described. As example of a connection of an embodiment of this invention to form more complex logic functions is shown in FIG. 2. This connection takes advantage of the availability of multiple outputs.

The logic gate circuit is represented as a block with a single input and multiple outputs. A logic gate circuit block 100 has an input A and outputs 101, 102 and 103. Output node 101 provides an inversion of input A or $\bar{A}$. Output node 102 is connected to the input of a logic gate circuit block 200. Output node 103 is connected to the input of a logic gate circuit block 400. Block 200 has output nodes 201 and 202. Each of these outputs provides an output which is a double inversion of the input or an A. A logic gate circuit block 300 has an input B and an output node 301 connected to the input of block 400. Also connected to the input of block 400 is an input C. Block 400 has an output 401 which provides an inversion of the sum of the inputs or $\overline{A + B + C}$.

Figure 3:
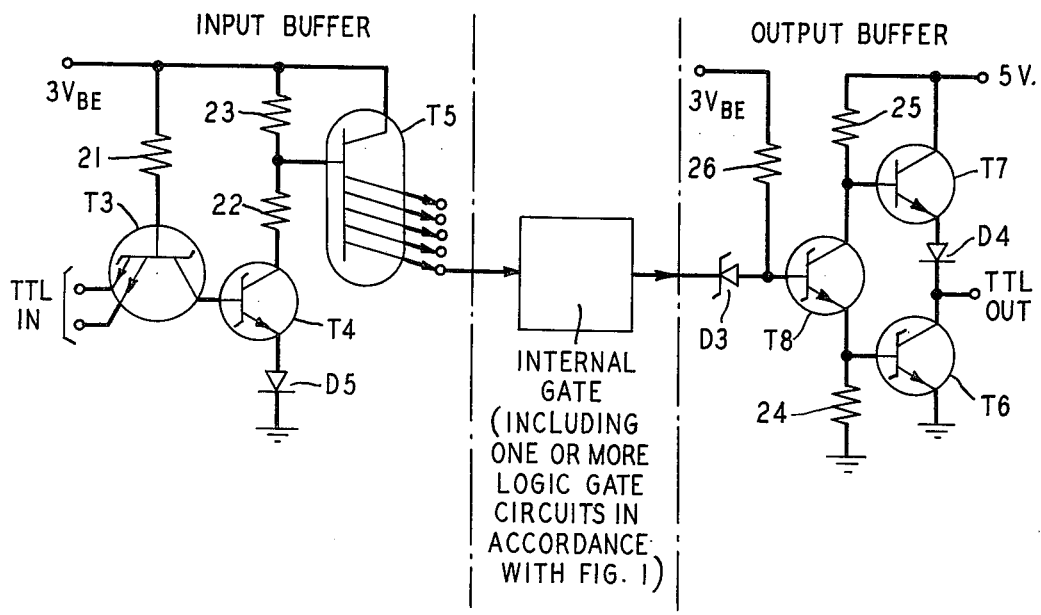
FIG. 3 shows the connection of the FIG. 1 logic gate to an input buffer and to an output buffer for interfacing with transistor-transistor logic circuits.

Because of the widespread use of TTL circuits it is advantageous for the logic circuit of FIG. 1 and more complex groupings of the circuit, such as that of FIG. 2, to be compatible with existing TTL circuits. This can be done by connecting the logic gate circuitry in accordance with this invention between an input buffer and an output buffer. FIG. 3 shows an example of such a connection and typical schematic diagrams of the input and output buffers. Each buffer converts the signal voltage to be compatible with the voltage levels of the subsequent stage.

The input buffer can take a plurality of input signals from a standard TTL circuit and provide the internal logic gate with an input signal at compatible voltage levels. In this particular embodiment of the invention the input voltage to the logic gate should be $V_{BE}$ or $2V_{BE}$. The output buffer can take an output from the internal logic gate and provide an input for a standard TTL circuit.

As indicated in FIG. 3, the input buffer includes a Schottky-clamped input transistor T3, a Schottky-clamped intermediate transistor T4 and an output transistor T5. Input transistor T3 has multiple emitters each of which is connected to an input node. The base of transistor T3 is connected to voltage $3V_{BE}$ through a resistor 21. The collector of transistor T3 is connected to the base of intermediate transistor T4. The emitter of transistor T4 is connected to ground through a diode D5. The collector of transistor T4 is connected through a serial combination of resistor 22 and 23 to voltage $3V_{BE}$. The base of output transistor T5 is connected to an intermediate node between resistors 22 and 23. The collector of transistor T5 is connected to voltage $3V_{BE}$. Transistor T5 has multiple emitters which are connected to respective output nodes.

The output buffer includes a Schottky-clamped transistor T8, a Schottky-clamped transistor T6 and a transistor T7. The base of transistor T8 is connected to the internal gate through a Schottky barrier diode D3. In addition, the base of T8 is connected to the voltage $3V_{BE}$ through a resistor 26. The emitter of transistor T8 is connected to the base of transistor T6. The base of transistor T6 is connected to ground through a resistor 24. The emitter of transistor T6 is connected to ground. The collector of transistor T8 is connected to the base of transistor T7. The base of transistor T7 is connected through a resistor 25 to a 5 volt voltage supply, a typical TTL voltage. The emitter of transistor T7 is connected to the collector of transistor T6 through a diode D4. The collector of transistor T6 is connected to an output node.

When the buffers perform the signal conversion one of the factors they compensate for is the different supply voltage levels. The standard TTL circuit uses a power supply voltage of 5V instead of the $3V_{BE}$ in this circuit. The connections from the logic gate to the output buffer can be made from the collector of the input transistor of the logic gate instead of one of the emitters of the output transistor. Both points at the same logical state, but the collector of the input transistor provides a larger voltage swing which is easier to couple into a standard TTL circuit.

Figure 4:
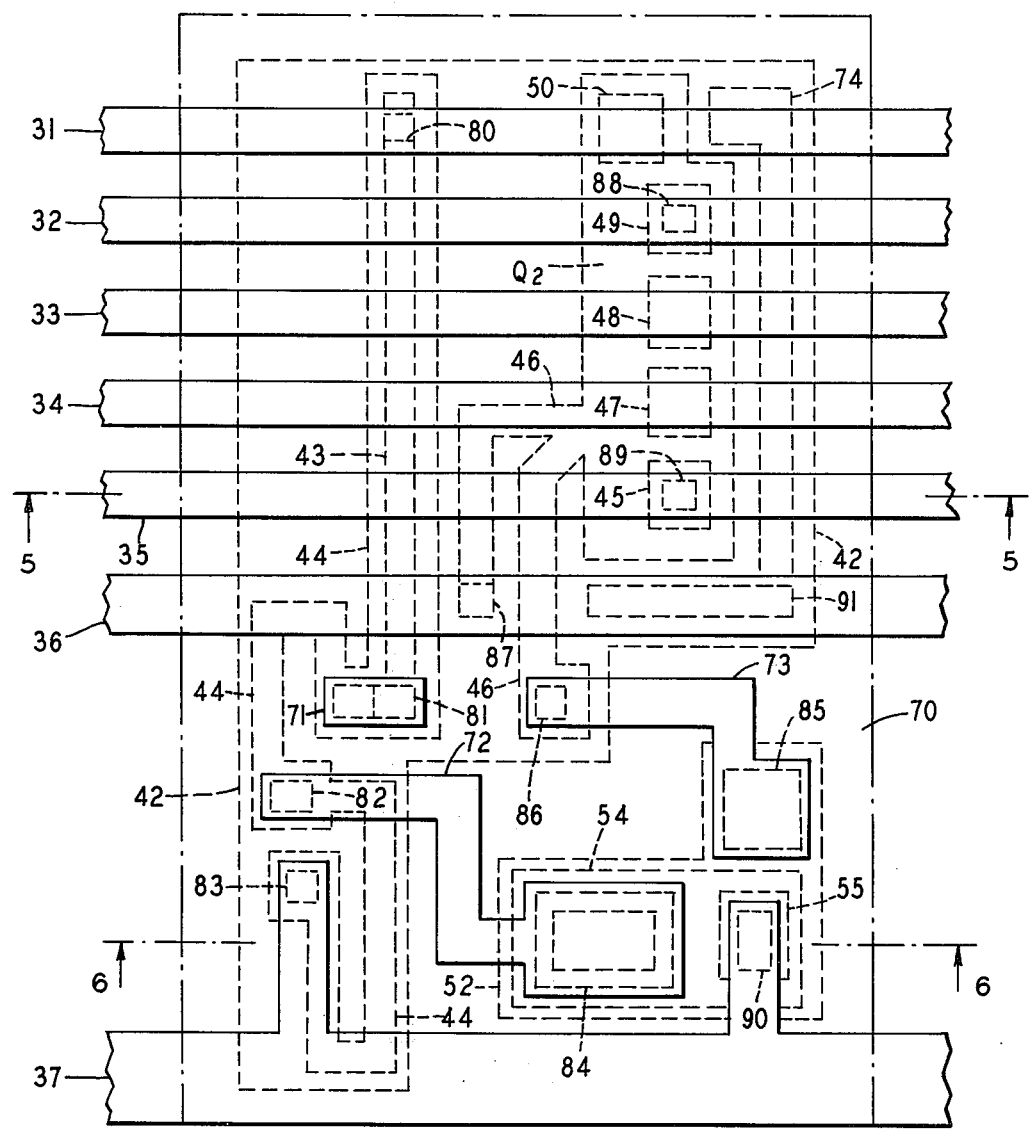
FIG. 4 shows a plan view of the integrated circuit layout of the FIG. 1 logic gate.

FIG. 4 shows a plan view of an integrated layout of the logic gate circuit shown in FIG. 1. Intercell wiring channels 31, 32, 33, 34, 35, 36 and 37 are conducting paths overlying an insulating layer 70. Channels 31 through 35 carry information signals to the input and from the outputs of the logic cell. Channel 36 is connected to the power supply and channel 37 is connected to ground. Between intercell wiring channels 36 and 37 are interacell wiring paths 71, 72 and 73.

Broken line patterns in FIG. 4 indicate either openings through layer 70 or impurity zones underlying layer 70. Broken line patterns 80, 81, 82, 83, 84, 85, 86, 87, 88, 89, 90 and 91 indicate openings through layer 70. The impurity zones defined by the broken line patterns form elements of the logic circuit of FIG. 1. For example, an impurity zone 44 forms input resistors 11 and 12. An impurity zone 46 forms the base of output transistor T2 and resistors 13 and 14. Impurity zones 45, 47, 48, 49 and 50 form the emitters of output transistor T2. An impurity zone 42 forms the collector of output transistor T2.

Further, an impurity zone 52 forms the collector of input transistor T1 and an impurity zone 54 forms the base of input transistor T1. From FIG. 4 it can be seen that zone 52 is L-shaped. Conducting path 72 contacts zone 52 at one extremity and conducting path 73 contacts zone 52 at the other extremity. The junction of path 72 and zone 52 forms Schottky barrier diode D1. The junction of path 73 and zone 52 forms Schottky barrier diode D2. Path 72 also contacts impurity zone 44 through an opening defined by pattern 82 shown in FIG. 4. The opening corresponds to a node between resistors 11 and 12. Path 73 contacts impurity zone 46 through an opening defined by pattern 86. Path 73 represents the connection between diode D2 and resistor 13. Further description of the integrated cell is more easily made when cross sectional views are taken.

Figure 5:
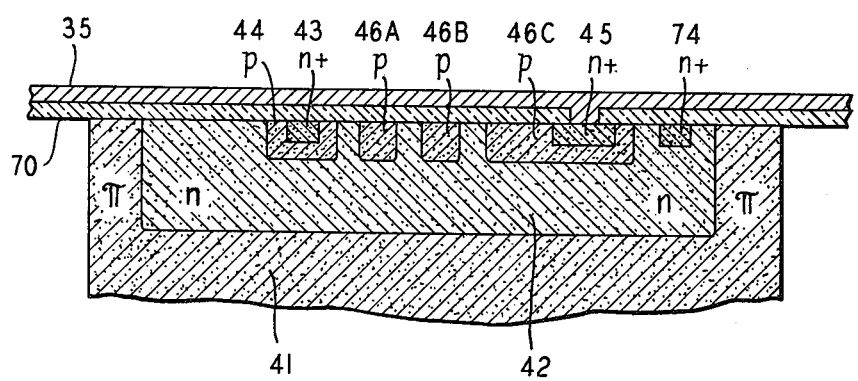
FIGS. 5 and 6 shows cross sections of the layout.

FIG. 5 is a cross sectional view of the integrated logic circuit taken along section 5—5 of FIG. 4. A substrate 41 has a p-type conductivity having a low concentration of impurities and is designated $\pi$. Typically, substrate 41 contains boron impurities at a concentration of about $10^{15}$ per cubic centimeter. Overlying substrate 41 is insulating layer 70. A cross section of intercell wiring channel 35 is shown overlying layer 70. Impurity zone 42 contains phosphorus impurities at a concentration of about $10^{17}$ per cubic centimeter.

The input to the logic cell is an elongated $n^+$-type inpurity zone 43 nested within zone 44 which is an elongated p-type impurity zone. Zone 44 is, in turn, nested within zone 42. $N^+$-type zone 42 and p-type zone 44 are connected by wiring path 71 as shown in FIG. 4. The connection is used to eliminate the capacitance created between zones 43 and 44.

FIG. 5 further shows cross sections of impurity zones which are parts of output transistor T2 and resistors 13 and 14. Zone 46 is a p-type conductivity region nested within zone 42. In FIG. 5, cross section 46A is part of resistor 14, cross section 46B is part of resistor 13 and cross section 46C is part of the base of transistor T2. Nested within zone 46 are $n^+$-type zones to form emitters of transistor T2. A cross section of one such emitter is shown in FIG. 5 as zone 45. An $n^+$-type zone 74 is nested within zone 42 and provides an improved ohmic contact to all of zone 42 from power supply channel 36.

Figure 6:
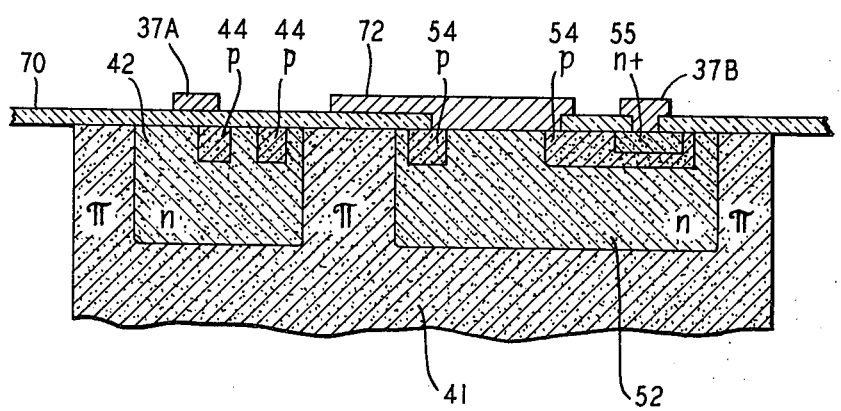

FIG. 6 shows a cross sectional view of the integrated logic circuit taken along section 6—6 of FIG. 4. Cross sections of p-type zone 44 nested within zone 42 are shown. The portions of zone 44 shown in FIG. 6 form a portion of resistor 12. Zone 52 is another n-type tub nested within substrate 41. An $n^+$-type zone 55 is nested within p-type base zone 54 and forms the emitter of transistor T1. Two extensions of intercell wiring channel 37 are also shown in FIG. 6 as cross sections labeled 37A and 37B. Extensions 37A contacts impurity zone 44 through an opening defined by pattern 83 in FIG. 4. This corresponds to the connection of resistor 12 to ground. Extension 37B grounds emitter zone 55.

Various other modifications and variations will no doubt occur to those skilled in the various arts to which this invention pertains. For example, modifications and changes may be made in the circuit shown and in the parameters listed above without departing from the spirit and scope of the present invention.

What is claimed is:

1. A two transistor logic gate circuit comprising:
   an input terminal and a plurality of output terminals,
   an input transistor having the emitter connected to a first bias terminal, and a first Schottky barrier diode connected between the base and collector, the collector being connected to a second bias terminal through a series combination comprising a second Schottky barrier diode, a first resistor, and a second resistor;
   an input resistance divider having a first terminal node connected to said input terminal for receiving an input signal, a second terminal node connected to said first bias terminal, and an intermediate node connected to the base of said input transistor; and
   a multi-emitter output transistor connected in an emitter follower configuration having the base connected to said series combination at a node between said first and second resistors, the collector connected to said second bias terminal, and each emitter connected to a different one of said plurality of output terminals.

2. A logic circuit as recited in claim 1 wherein the parameters of the first and second Schottky barrier diodes are chosen so the voltage across the first Schottky barrier diode is about equal to the voltage across the second Schottky barrier diode.

3. A logic circuit as recited in claim 1 wherein the ratio of the resistance between the two terminal nodes of the input resistance divider and the resistance between the intermediate node and the second terminal node of the input resistance divider is about 1.5.

4. A logic circuit as recited in claim 1 wherein a voltage source is connected to said second bias terminal for applying thereto a voltage whose magnitude is approximately three times the base-emitter voltage of the input transistor.

5. A logic circuit as recited in claim 1 wherein the circuit parameters of the input and output transistors are such that the magnitude of the base-emitter voltage of the input transistor about equals the magnitude of the base-emitter voltage of the output transistor.

6. A two transistor logic gate circuit comprising:
   an input transistor having a Schottky-clamp diode connected between the base and the collector, and having the emitter connected to ground,
   an input resistance divider having a first terminal node for receiving an input signal, a second terminal node connected to ground, and an intermediate node connected to the base of the input transistor wherein the ratio of the resistance between the two terminal nodes of the input resistance divider and the resistance between the intermediate node and the second terminal node of the input resistance divider is about 1.5,
   a series combination including a Schottky barrier diode, a first resistor, and a second resistor connected between the collector of the input transistor and a voltage source wherein the parameters of the diodes are chosen so that the voltage across the Schottky-clamp diode is about equal to the voltage across the Schottky barrier diode, and
   an output transistor having multiple emitters and connected in an emitter-follower configuration such that its base is connected to a node between the first and the second resistor, its collector being connected to said voltage source and each emitter of the output transistor being connected to an output node, wherein the circuit parameters of the output transistor are such that the magnitude of the base-emitter voltage of the output transistor about equals the magnitude of the base-emitter voltage of the input transistor.

7. A logic gate circuit as recited in claim 6 wherein the magnitude of the voltage source is approximately three times the base-emitter voltage of the input transistor.

* * * * *